(12) United States Patent
Akimoto

(10) Patent No.: US 6,190,063 B1
(45) Date of Patent: Feb. 20, 2001

(54) DEVELOPING METHOD AND APPARATUS

(75) Inventor: Masami Akimoto, Kumamoto (JP)

(73) Assignee: Tokyo Electron Ltd. (JP)

( * ) Notice: Under 35 U.S.C. 154(b), the term of this patent shall be extended for 0 days.

(21) Appl. No.: 09/224,995

(22) Filed: Jan. 4, 1998

(30) Foreign Application Priority Data

Jan. 9, 1998 (JP) ................................................. 10-013481

(51) Int. Cl.$^7$ ....................................................... G03D 5/00
(52) U.S. Cl. ........................ 396/611; 396/574; 396/627; 118/326; 118/52; 430/325
(58) Field of Search .................................... 396/604, 611, 396/626, 627; 118/326, 300, 52, 54, 319, 320, 712; 430/330, 325, 326, 329; 156/646

(56) References Cited

U.S. PATENT DOCUMENTS

| | | | |
|---|---|---|---|
| 5,342,738 | * 8/1994 | Ikeda | 430/325 |
| 5,700,629 | * 12/1997 | Kakumaru | 430/325 |
| 5,944,894 | * 8/1999 | Kitano et al. | 118/326 |

FOREIGN PATENT DOCUMENTS

| | | | |
|---|---|---|---|
| 2-46465 | * 2/1990 | (JP) | 396/FOR 942 |
| 6-310417 | 11/1994 | (JP) . | |

* cited by examiner

Primary Examiner—D. Rutledge
(74) Attorney, Agent, or Firm—Rader, Fishman & Grauer

(57) ABSTRACT

After a developer is applied to a semiconductor wafer, a head member having a plurality of fluid discharge holes is positioned so as to face the wafer, and during development of the wafer, a fluid is discharged from the discharge holes of the head member toward the developer on the wafer. By supplying the fluid to a region of the wafer where the line widths of the resulting circuit pattern are liable to become uneven, the temperature, thickness, liquid surface state, etc. of the developer in this region are controlled.

16 Claims, 9 Drawing Sheets

DEVELOPING METHOD AND APPARATUS

BACKGROUND OF THE INVENTION

The present invention relates to a developing method and apparatus capable of controlling the progress of development of a predetermined region of a substrate such as a semiconductor wafer during a developing process, to accelerate the development and thereby form a circuit pattern on the substrate so that line widths thereof may be uniform.

In a coating-development system for carrying out a photolithography process during the manufacture of semiconductor devices, for example, a resist coating process is performed in which a resist film is formed on the surface of a semiconductor wafer (hereinafter merely referred to as "wafer") and also a developing process is performed in which the wafer is developed after being applied with the resist and exposed to light.

In the developing process, a wafer, on which light has been irradiated according to a predetermined circuit pattern and which has been subjected to a postexposure-baking process and a cooling process, is transported to a developing unit and mounted to a spin chuck. A developer is supplied from a developer feed nozzle and applied to the entire surface of the wafer to a thickness of, for example, 1 mm. The wafer is then left at rest for a predetermined time with the developer applied thereto, and while the wafer is left to stand, development progresses due to natural convection. The wafer is thereafter rotated by the spin chuck so that the developer may be shaken off, and then a rinsing liquid is discharged from a rinse feed nozzle to wash off the developer remaining on the wafer. Subsequently, the spin chuck is rotated at high speed, whereby the developer and the rinsing liquid remaining on the wafer fly off and the wafer becomes dry. This completes a series of steps of the developing process.

Meanwhile, in recent years, there is an increasing demand for miniaturization of circuit patterns formed on wafers, and to this end, development should desirably be caused to progress so that the line widths of the resulting circuit pattern may be uniform over the entire region of the wafer.

During the development, however, the developer merely remains stationary on the wafer as stated above, and the progress of the development depends entirely upon natural convection of the developer. Further, the line widths of a circuit pattern are affected not only by conditions of the exposure process such as the exposure time and the amount of light exposure, but also by the temperature of the developer, the developing time, etc., and thus it is difficult to cause the development of a circuit pattern to progress in such a manner that the line widths of the resulting circuit pattern are uniform over the entire region of the wafer.

BRIEF SUMMARY OF THE INVENTION

An object of the present invention is to provide a developing method and apparatus capable of controlling the development of a substrate so that the line widths of a circuit pattern formed on the substrate may be uniform.

According to a first aspect of the present invention, there is provided a developing method for performing a developing process by applying a developer to a surface of a substrate which has been subjected to an exposure process, wherein the method comprises the step of supplying a fluid to the developer on the substrate when the developer is applied to the surface of the substrate, to thereby control the developing process.

According to a second aspect of the present invention, there is provided a developing method for performing a developing process by applying a developer to a surface of a substrate which has been subjected to an exposure process, wherein the method comprises the step of controlling temperature and humidity of an atmosphere surrounding the substrate when the developer is applied to the surface of the substrate.

According to a third aspect of the present invention, there is provided a developing apparatus for performing a developing process by applying a developer to a surface of a substrate which has been subjected to an exposure process, wherein the apparatus comprises:
a supporting member for supporting a substrate; a developer feed nozzle for supplying and thereby applying a developer to a surface of the substrate; and
a fluid supply mechanism for supplying a fluid for controlling the developing process to the substrate applied with the developer.

According to the first aspect of the present invention, when the developer is applied to the surface of the substrate, the fluid is supplied to the developer on the substrate to control the developing process, whereby the development can be made to progress properly and unevenness of development can be eliminated. Consequently, circuit patterns having desired and yet uniform line widths can be formed on substrates. Specifically, in cases where there is a difficulty in obtaining desired line widths over the entire surface of the wafer, the fluid may be supplied uniformly to the entire surface of the substrate to control the developing process. Also, the fluid may be supplied locally to a region of the wafer where the line widths of the circuit pattern are liable to become uneven, for example, and in this case, the temperature, thickness, liquid surface state, etc. of the developer in this region and thus the developing process can be controlled so that the line widths of the resulting circuit pattern may be uniform. Further, the fluid to be supplied may be high-humidity air, in which case evaporation of the developer is suppressed and the line widths can be prevented from becoming uneven due to reduction in temperature of the developer. Where air whose pH value has been controlled is supplied as the fluid, moreover, substances that adversely affect the development, such as ammonia, can be removed.

According to the second aspect of the present invention, when the developer is applied to the surface of the substrate, the temperature and humidity of the atmosphere surrounding the substrate are controlled to thereby control evaporation of the developer, whereby local reduction in temperature of the developer induced by heat of vaporization can be suppressed and the line widths can be prevented from becoming uneven.

According to the third aspect of the present invention, since the fluid for controlling the developing process is supplied to the substrate applied with the developer, failure of expected development and unevenness of development can be eliminated and circuit patterns having desired and yet uniform line widths can be formed on substrates.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
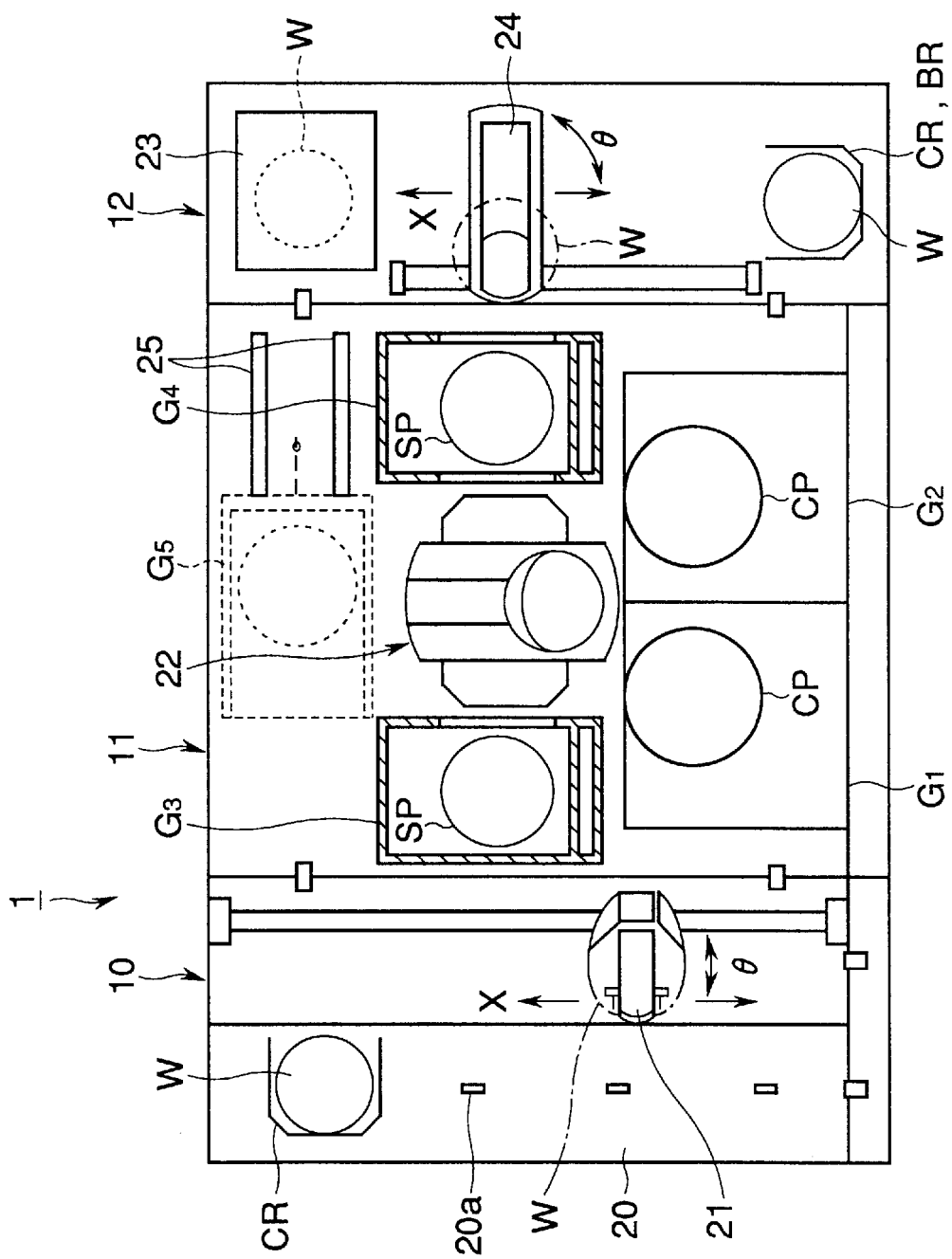
FIG. 1 is a plan view showing the entire arrangement of a resist coating-development system for semiconductor wafers according to one embodiment of the present invention.
Figure 2:
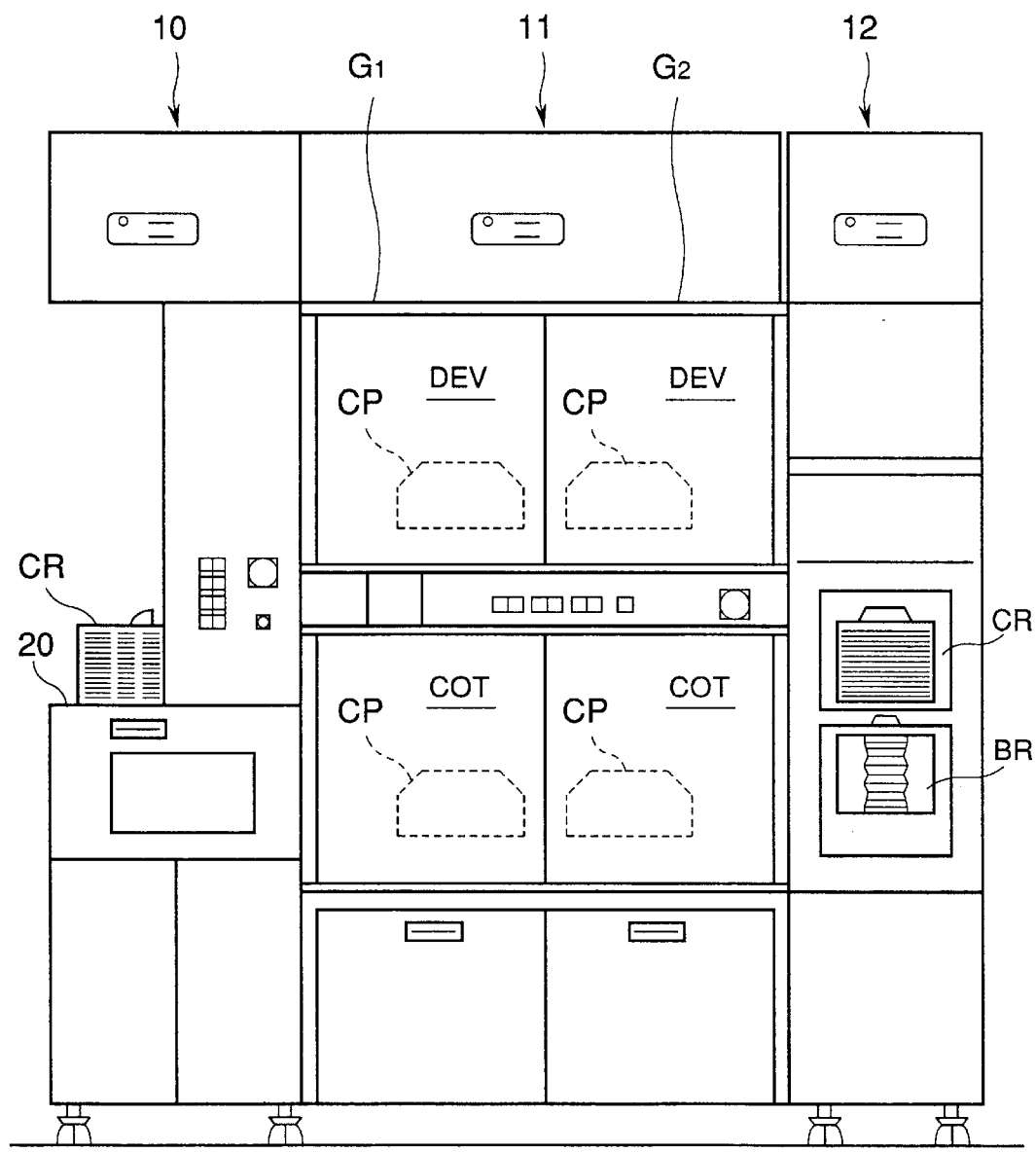
FIG. 2 is a front view showing the entire arrangement of the resist coating-development system of FIG. 1.
Figure 3:
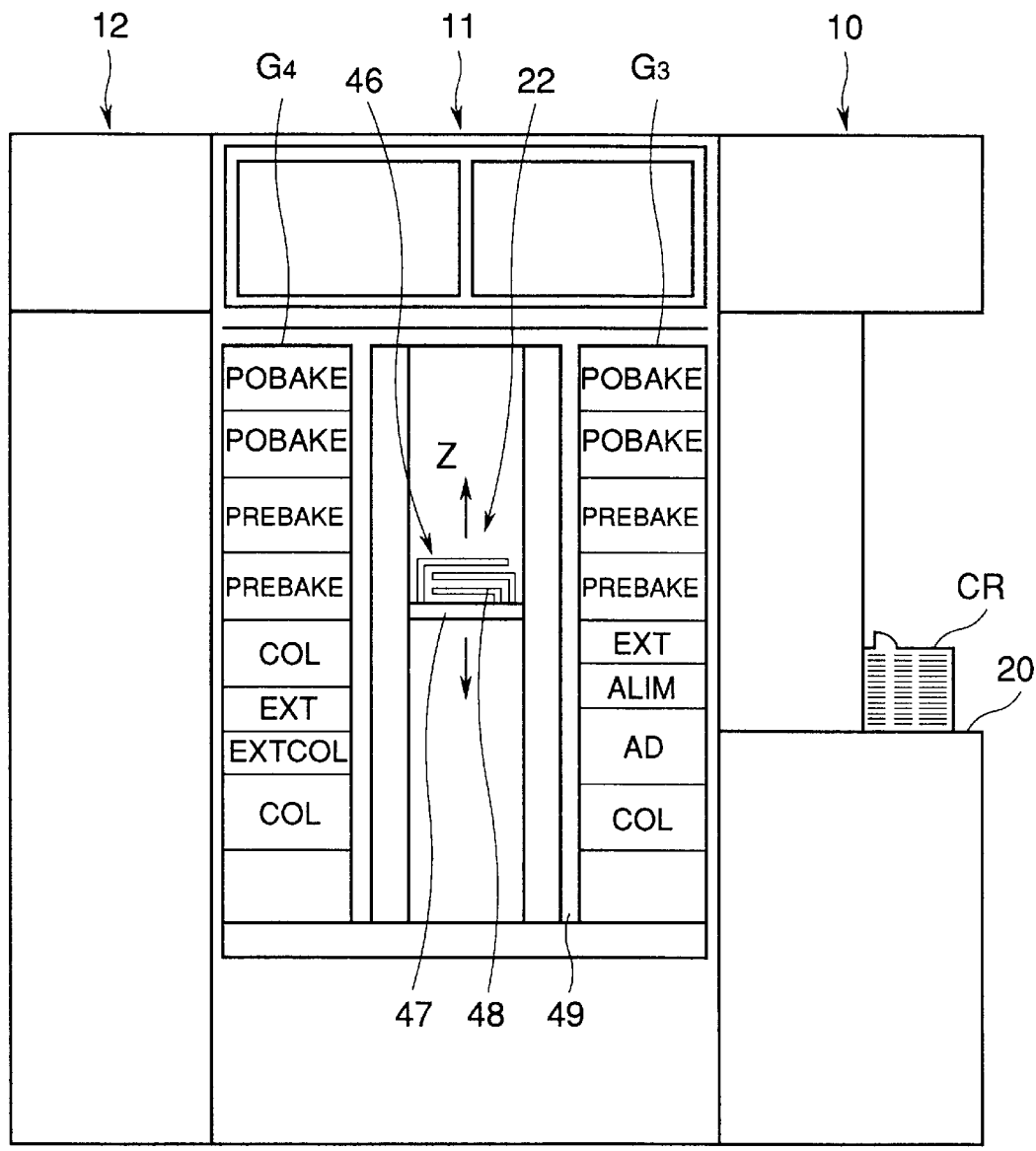
FIG. 3 is a rear view showing the entire arrangement of the resist coating-development system of FIG. 1.

Embodiments of the present invention will be hereinafter described with reference to the accompanying drawings. FIGS. 1 to 3 show the entire arrangement of a coating-development system for semiconductor wafers (hereinafter merely referred to as "wafers") according to an embodiment of the present invention, wherein FIGS. 1, 2 and 3 are a plan view, a front view and a rear view, respectively, of the system.

As shown in FIG. 1, the coating-development system 1 comprises a cassette station 10, a processing station 11 and an interface section 12 integrally connected to one another. The cassette station 10 is a station where wafer cassettes CR, each containing 25 wafers W, for example, are transported to the system from outside and vice versa and also wafers W are loaded into and unloaded from the wafer cassettes CR. The processing station 11 includes a plurality of groups of various processing units placed one upon another at respective predetermined positions for performing predetermined single wafer processing on each of wafers W in the course of a coating-developing process. The interface section 12 serves to transfer wafers W to and from an exposure unit (not shown) arranged adjacent to the processing station 11.

The cassette station 10 has a cassette table 20, as shown in FIG. 1, on which a plurality of, for example, four wafer cassettes CR are placed. in line along X direction while being engaged with respective positioning protuberances 20a, with their wafer inlet/outlet opening facing the processing station 11. A wafer transporting unit 21, which is movable in the direction (X direction) of arrangement of the cassettes as well as in the direction (Z direction, i.e., vertical direction) of arrangement of wafers contained in the wafer cassette CR, selectively accesses each of the wafer cassettes CR.

The wafer transporting unit 21 is also rotatable in θ direction and can access an alignment unit (ALIM) and an extension unit (EXT) belonging to a third processing unit group $G_3$ of the processing station 11, as described later.

The processing station 11 is provided with a vertical transportation type main wafer transporting mechanism 22 having a wafer transporting device, as shown in FIG. 1, and all groups of processing units placed one upon another are arranged around the transporting mechanism 22.

As shown in FIG. 3, the main wafer transporting mechanism 22 has a wafer transporting device 46 arranged inside a cylindrical supporting member 49 and movable in the vertical direction (Z direction). The cylindrical supporting member 49 is connected to the rotary shaft of a motor (not shown) and is rotated, together with the wafer transporting device 46, about the rotary shaft by the rotatory driving force of the motor, whereby the wafer transporting device 46 can be rotated in the θ direction.

The wafer transporting device 46 has a plurality of retaining members 48 movable back and forth relative to a transporting base 47, and the wafers W are transferred between the processing units by means of the retaining members 48.

In the example shown in FIG. 1, the processing units can be arranged in a manner such that they are divided into five processing unit groups $G_1$, $G_2$, $G_3$, $G_4$ and $G_5$ each including a plurality of units placed one upon another. The first and second processing unit groups $G_1$ and $G_2$ are arranged at the front of the system (lower part in FIG. 1), the third processing unit group $G_3$ is arranged adjacent to the cassette station 10, and the fourth processing unit group $G_4$ is arranged adjacent to the interface section 12. The fifth processing unit group $G_5$ is arranged at the rear of the system.

As shown in FIG. 2, the first processing unit group $G_1$ comprises two spinner type processing units for performing respective predetermined processes on a wafer W placed on a spin chuck inside a cup CP, for example, a resist coating unit (COT) and a developing unit (DEV) placed on the resist coating unit. The second processing unit group $G_2$ also comprises two spinner type processing units, for example, a resist coating unit (COT) and a developing unit (DEV) placed on the resist coating unit.

The third processing unit group $G_3$ comprises, as shown in FIG. 3, eight oven type processing units for performing respective predetermined processes on a wafer W placed on a table SP, for example, a cooling unit (COL) for performing a cooling process, an adhesion unit (AD) for performing a so-called hydrophobic process to enhance the adhesion of the resist, an alignment unit (ALIM) for positioning, an extension unit (EXT), prebaking units (PREBAKE) each for performing a heating process prior to an exposure process, and postexposure-baking units (POBAKE) each for performing a heating process after the exposure process, which units are arranged one upon another from the bottom upward in the order mentioned. The fourth processing unit group $G_4$ also comprises eight oven type processing units, for example, a cooling unit (COL), an extension-cooling unit (EXTCOL), an extension unit (EXT), another cooling unit (COL), prebaking units (PREBAKE) and postexposure-baking units (POBAKE), which units are arranged one upon another from the bottom upward in the order mentioned.

The interface section 12 has a dimension in the depth direction (X direction) identical with that of the processing station 11, as shown in FIG. 1, but a dimension thereof in the width direction is smaller than that of the processing station 11. In the front portion of the interface section 12, a movable pickup cassette CR and a fixed buffer cassette BR are placed one upon the other, and a wafer edge exposure unit 23 and a wafer transporting unit 24 are arranged in the rear and central portions, respectively, of the interface section 12. The wafer transporting unit 24 is movable in the X and Z directions and thus can access the two cassettes CR and BR as well as the peripheral exposure unit 23. The wafer transporting unit 24 is also rotatable in the θ direction, so that it can access the extension unit (EXT) among the multiple units of the fourth processing unit group $G_4$ of the processing station 11, as well as a wafer transfer table (not shown) of the exposure unit adjacent thereto.

In the coating-development system 1, the fifth processing unit group $G_5$ having a plurality of units placed one upon another is arranged at the back of the main wafer transporting mechanism 22, as indicated by broken lines in FIG. 1. The multiple units of the fifth processing unit group $G_5$ can be moved along guide rails 25 to one side with respect to the main wafer transporting mechanism 22. Accordingly, even in the case where the multiple units of the fifth processing unit group $G_5$ are arranged as illustrated, they can be slid along the guide rails 25 to make a space, thus facilitating the maintenance of the main wafer transporting mechanism 22 from the rear side.

Figure 4:
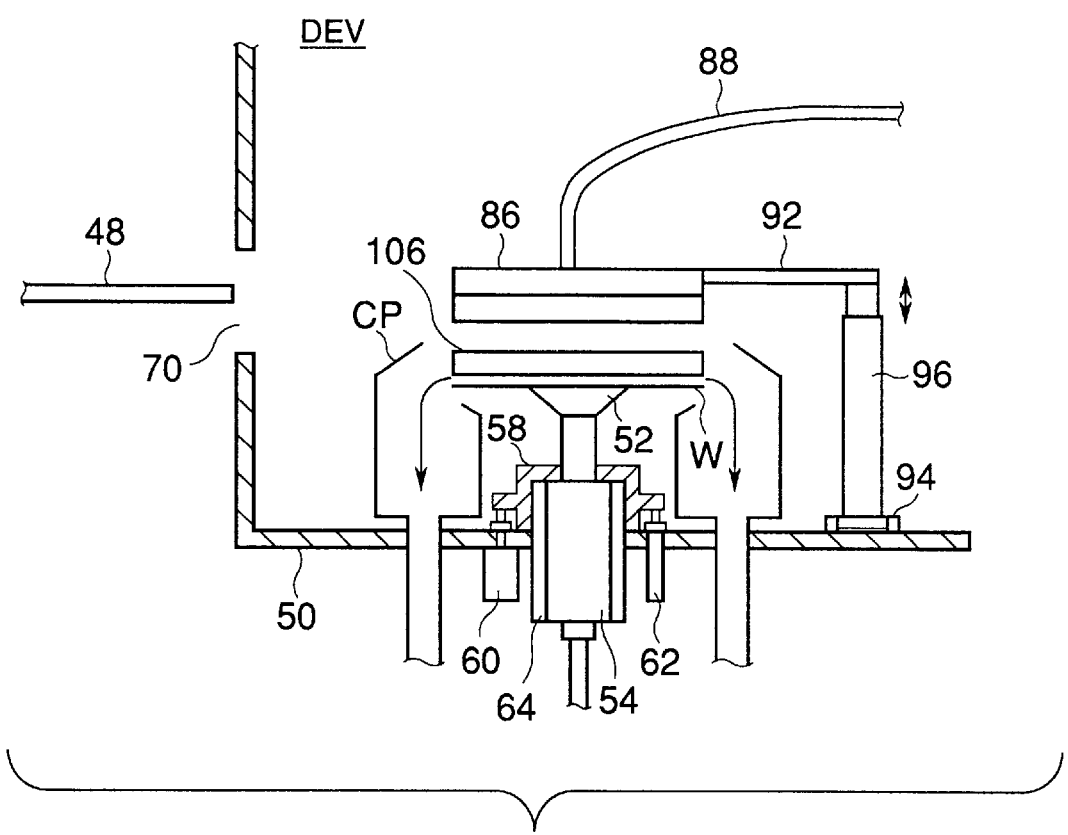
FIG. 4 is a sectional view showing the entire arrangement of a developing unit mounted to the resist coating-development system of FIG. 1.
Figure 5:
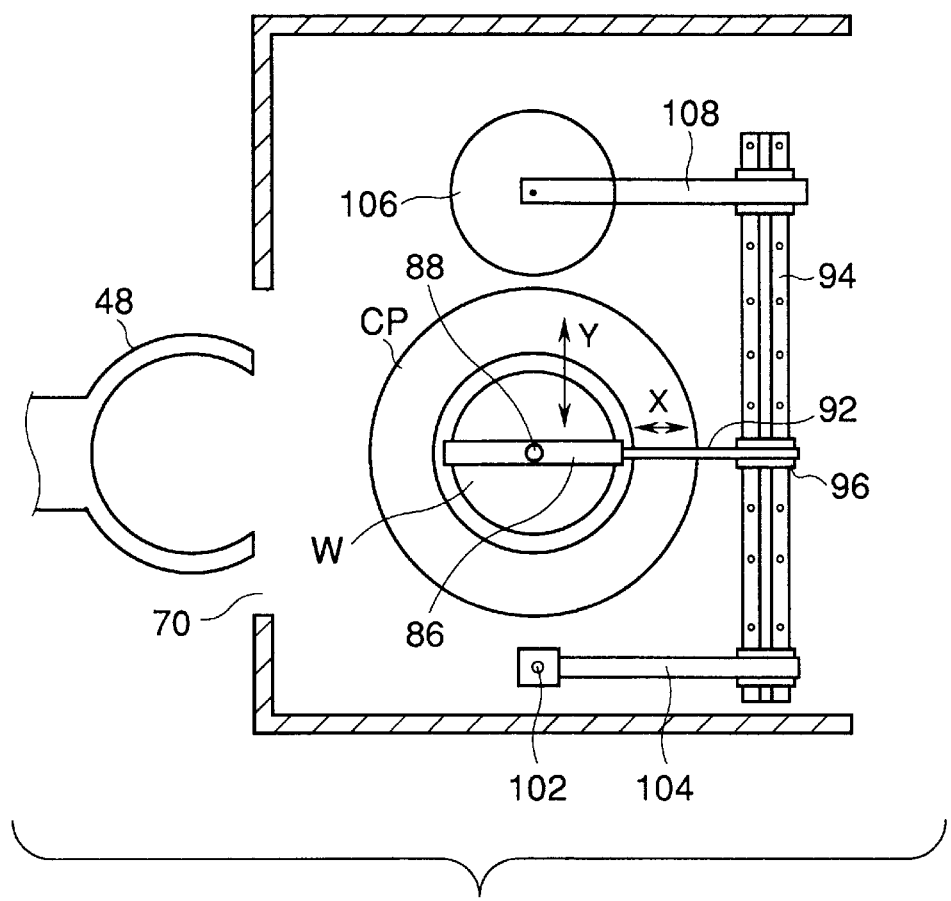
FIG. 5 is a plan view of the developing unit mounted to the resist coating-development system of FIG. 1.

The developing unit (DEV) in the aforementioned system 1 will be now described. FIGS. 4 and 5 are a schematic sectional view and a schematic plan view, respectively, showing the entire arrangement of the developing unit (DEV).

In the central portion of the developing unit (DEV) is arranged an annular cup CP, and a spin chuck 52 is arranged inside the cup CP. The spin chuck 52 is rotated by a drive motor 54 with a wafer W retained fast thereon by vacuum suction. The drive motor 54 is vertically movably arranged in an opening in a bottom plate 50 of the unit, and is coupled to lifting means 60, which comprises an air cylinder, for example, and lift guide means 62 via a cap-shaped flange member 58 made of aluminum, for example. A cylindrical cooling jacket 64 made of stainless steel, for example, surrounds the outer periphery of the drive motor 54, and the flange member 58 covers approximately the upper half of the cooling jacket 64.

During application of a developer, the lower end of the flange member 58 is in close contact with a portion of the bottom plate 50 surrounding the opening. When a wafer W is transferred between the spin chuck 52 and the main wafer transporting mechanism 22, on the other hand, the lifting means 60 raises the drive motor 54 along with the spin chuck 52, so that the lower end of the flange member 58 is separated from the bottom plate 50. The casing of the developing unit (DEV) has a window 70 formed therein so that the wafer retaining member 48 can enter the unit through the window 70.

A developer feed nozzle 86 for supplying the developer to the surface of the wafer W is connected to a developer supply section, not shown, via a developer feed tube 88. The developer feed nozzle 86 is detachably mounted to a distal end portion of a nozzle scan arm 92. The scan arm 92 is attached to an upper end of a vertical supporting member 96 which is horizontally movable on guide rails 94 extending in one direction (Y direction) on the bottom plate 50, and is moved, together with the vertical supporting member 96, in the Y direction by a Y-direction actuating mechanism, not shown.

Figure 6:
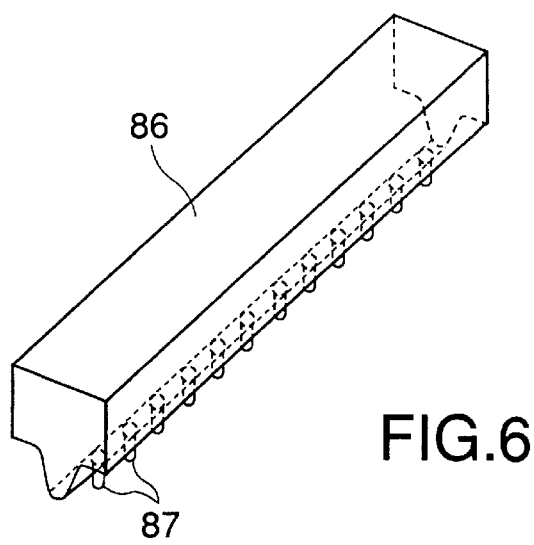
FIG. 6 is a perspective view showing a developer feed nozzle used in the developing unit.

The developer feed nozzle 86 extends horizontally, and when the developer is applied, the nozzle 86 is located above the central portion of the wafer W so as to cover the diameter of the wafer W, as shown in FIG. 4. The developer feed nozzle 86 has a plurality of discharge holes 87 in a lower surface thereof, as shown in FIG. 6, and the developer discharged therefrom forms a strip- or sheet-like flow as a whole. During application of the developer, while the developer is discharged in the form of a strip from the developer feed nozzle 86 located above the wafer W, the wafer W is caused to make, for example, one complete rotation, whereby the developer is applied to the entire surface of the wafer W. The developer feed nozzle 86 may alternatively have a slit-like developer discharge hole. Also, when the developer is discharged, the developer feed nozzle 86 may be moved along the guide rails 94, instead of rotating the wafer W, so that the wafer W may be scanned. It is to be noted that the developer feed nozzle 86 is not limited to the aforementioned types and may be of a different type.

A rinse nozzle 102 is also provided for discharging a rinsing liquid and is attached to a distal end of a nozzle scan arm 104 which is movable in the Y direction on the guide rails 94. After the development by means of the developer, the rinse nozzle 102 moves to a position above the wafer W and discharges the rinsing liquid to the wafer W.

This embodiment is further provided with a head member 106 which can be located so as to face the wafer W for discharging a fluid. The head member 106 is attached to a distal end of an actuating mechanism 108 movable in the Y direction on the guide rails 94, as shown in FIG. 5, so that it can be moved between a position facing the wafer W and the retracted position as illustrated. The retracted position is not limited to that shown in the figure in which the head member is located on one side of the wafer W, and may be a position above the wafer W.

Figure 7:
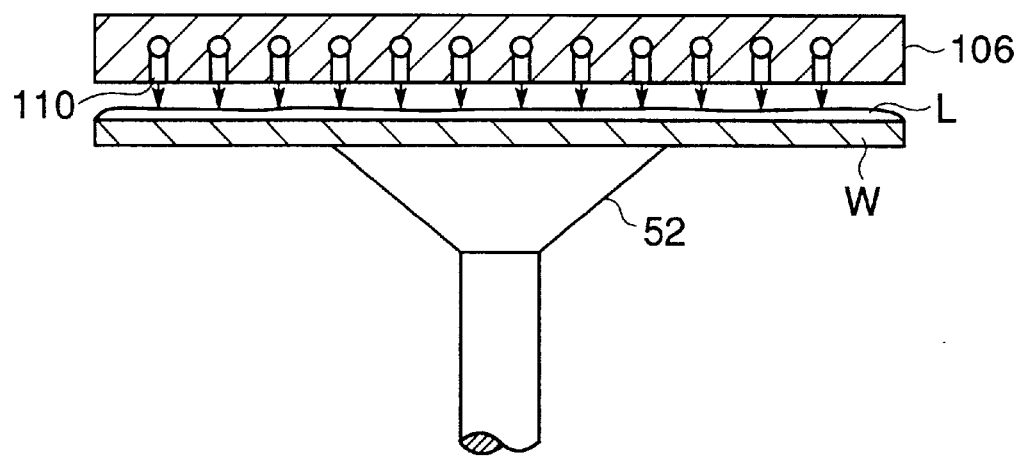
FIG. 7 is an enlarged sectional view showing a wafer applied with a developer and a head member in the developing unit.
Figure 8:
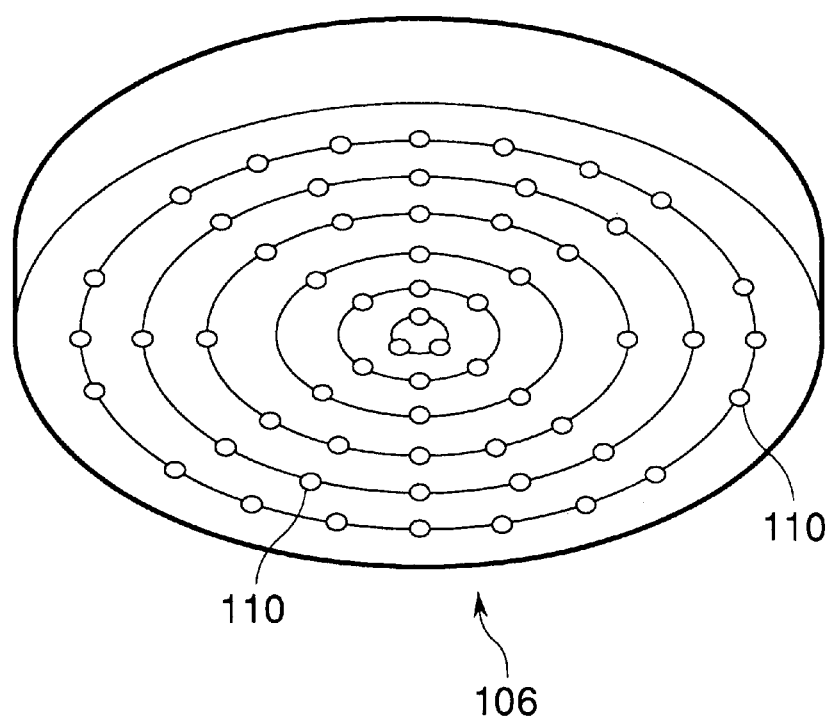
FIG. 8 is a perspective view of the head member of the developing unit, as viewed obliquely from below.

As shown in FIGS. 7 and 8, the head member 106 has a circular shape corresponding to the shape of the wafer W and the size thereof is also substantially identical with that of the wafer W. A large number of fluid discharge holes 110 are formed in the lower surface of the head member 106. The fluid discharge holes 110 are arranged such that they are located on a plurality of circles concentric with the head member 106, as shown in FIG. 8, and a predetermined fluid is discharged from the fluid discharge holes 110 toward the developer L on the wafer W.

Figure 9:
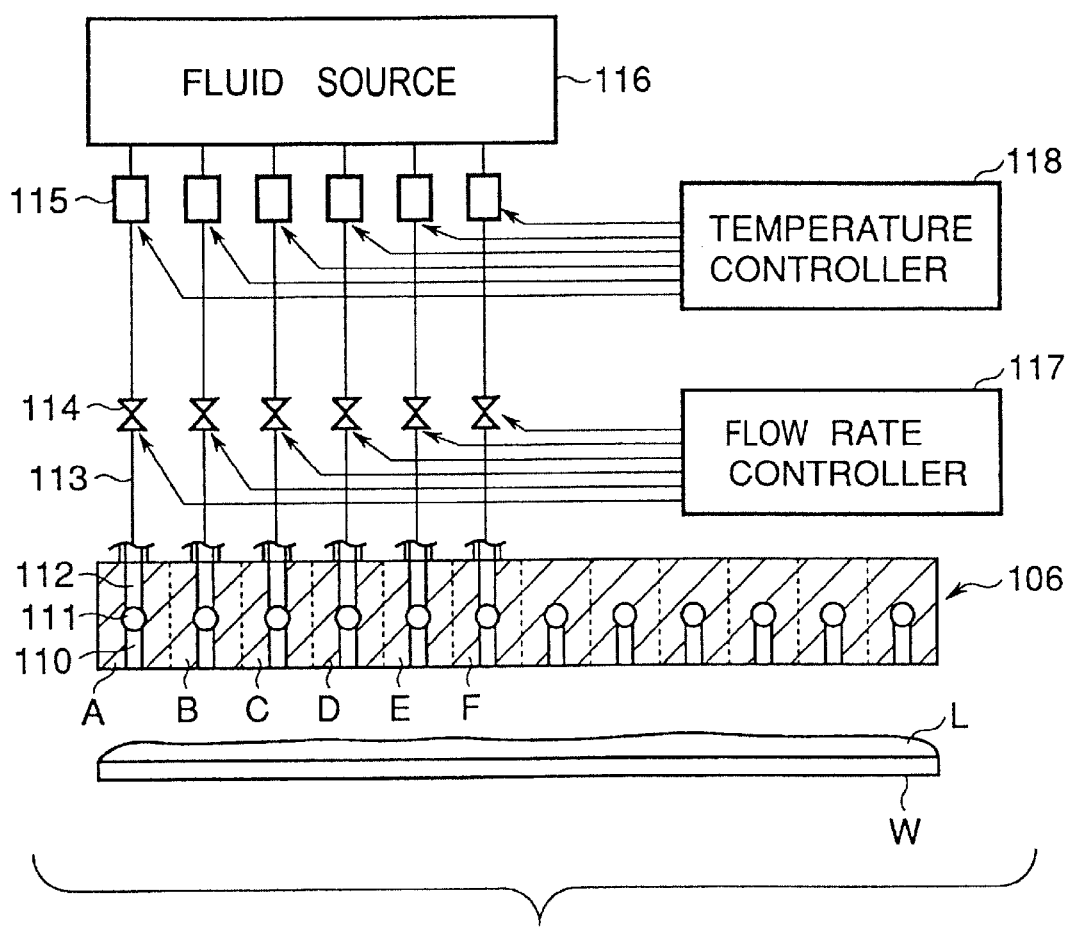
FIG. 9 is a sectional view showing a fluid control system for the head member of the developing unit.

The head member 106 has a plurality of concentric regions A to F corresponding to the concentric arrangement of the fluid discharge holes 110, as shown in FIG. 9. The fluid discharge holes 110 belonging to the respective regions A to F are connected to corresponding ones of annular fluid passages 111. The fluid passages 111 are formed in the head member 106 concentrically therewith and are connected to respective fluid holes 112 extending upward. Each fluid hole 112 is connected to a fluid source 116 via a corresponding fluid tube 113. A flow regulating valve 114 and a temperature controlling jacket 115 are arranged in each of the fluid tubes 113. The openings of the flow regulating valves 114 are controlled by a flow rate controller 117, and the temperatures of the temperature controlling jackets 115 are controlled by a temperature controller 118. Accordingly, the amount and temperature of the fluid discharged to the developer L can be controlled for each of the concentric regions of the head member 106, and thus can be varied for respective regions of the wafer W. It is also possible to supply the fluid of predetermined temperature at a predetermined flow rate only to that region of the wafer W which needs to be supplied with the fluid.

The regions of the head member 106 are not limited to concentric in shape but may be of any desired subdivided regions; for example, the lower surface of the head member may be divided into two semicircular regions or be divided by straight lines parallel to a diametrical direction into three or more regions. Also, a tube may be connected to each of the discharge holes 110 so that the flow rate of the fluid discharged from each discharge hole 110 can be controlled. In this case, the fluid discharge amounts can be more finely controlled.

The fluid to be discharged may be either gas or liquid. For such gas, N2 or air may be used, for example, and for the liquid, pure water may be used, for example. In cases where N2 or air is discharged, by varying its discharge temperature and discharge amount, it is possible to change the temperature, thickness, liquid surface state, etc. of the developer on the wafer W and thereby to control the progress of development. Where pure water is discharged, the development is suspended as soon as the developer contacts with pure water; in this case, therefore, the progress of development can be controlled by suspending the development. Further, high-humidity air may be used as the fluid to be supplied to the wafer W, in which case the developer can be prevented from evaporating. Air of which the pH value has been controlled may also be used as the fluid to be supplied to the wafer W.

The developing operation of the developing unit (DEV) constructed as described above will be now described.

A wafer W, which has been irradiated with a predetermined pattern of light and has undergone the postexposure-baking process and the cooling process, is transported to a position right above the cup CP by the main wafer transporting mechanism 22 and is then attracted by vacuum suction to the spin chuck 52 which has been raised by the lifting means 60.

Subsequently, the developer feed nozzle 86 is moved to a position above the wafer W, and while the developer is discharged in the form of a strip from the developer feed nozzle 86, the wafer W is caused to make one complete rotation, for example, so that the developer is applied to the entire surface of the wafer W to a thickness of, for example, 1 mm.

In this case, the head member 106 is positioned by the actuating mechanism 108 so as to face the wafer W, and the fluid is discharged from all or some of the discharge holes 110 of the head member 106 toward the developer L on the wafer W so that the fluid may be discharged over the entire surface of the wafer W or be discharged locally. If the fluid is discharged uniformly over the entire surface of the wafer W, then it is possible to control the development of the wafer W as a whole. If, on the other hand, the fluid of different temperatures is discharged at different flow rates from the respective regions of the head member 106 with the aid of the flow rate controller 117 and the temperature controller 118, the development of the individual regions of the wafer W can be controlled. Further, the fluid of which the flow rate and temperature have been controlled to respective predetermined values may be discharged from the discharge holes 110 of the head member 106 locally to a specified region (e.g., central region or peripheral region) of the wafer W where the line widths are expected to become uneven, for example; in this case, the temperature, thickness, liquid surface state, etc. of the developer in this region alone can be controlled so that the developed state of the region may be identical with that of the other regions of the wafer W.

In this manner, the development is carried out with the fluid discharged to the developer L on the wafer W, and when the development has been completed after a lapse of a predetermined time, the head member 106 is moved to the retracted position.

Subsequently, the wafer W is rotated by the spin chuck 52 to shake off the developer. The rinse nozzle 102 is then moved to a position above the wafer W, and the rinsing liquid is discharged from the rinse nozzle 102 to wash off the developer remaining on the wafer W.

The spin chuck 52 is thereafter rotated at high speed, whereby the developer and the rinsing liquid remaining on the wafer W fly off and the wafer W becomes dry. This completes a series of steps of the developing process.

As described above, according to this embodiment, the temperature, thickness, etc. of the developer L on the wafer W can be controlled by discharging a predetermined fluid from the individual regions of the head member 106, whereby the developing process is controlled so that circuit patterns having desired and yet uniform line widths can be formed.

More specifically, to control the development of the entire surface of the wafer uniformly to obtain desired line widths, a predetermined fluid of predetermined temperature may be supplied at a predetermined flow rate uniformly to the developer L on the wafer W. Where the development needs to be controlled differently for different regions of the wafer W, the fluid of different temperatures may be discharged at different flow rates from the respective regions of the head member 106 with the aid of the flow rate controller 117 and the temperature controller 118. Also, by discharging the fluid of which the flow rate and temperature have been controlled to respective predetermined values from the discharge holes 110 of the head member 106 locally to a specified region (e.g., central region or peripheral region) of the wafer W where the line widths are expected to become uneven, for example, the temperature, thickness, liquid surface state, etc. of the developer in this region alone can be controlled so that the developed state of the region may be identical with that of the other regions of the wafer W. In this manner, the progress of the development after application of the developer can be properly controlled, and thus circuit patterns having desired and yet uniform line widths can be formed.

In the case where gas such as N2 or air is used as the fluid to be discharged from the head member 106, the discharge temperature and discharge amount of such gas are varied to thereby change the temperature, thickness, liquid surface state, etc. of the developer on the wafer W, so that the development can be controlled. By discharging a small amount of pure water to the peripheral portion of the wafer W, on the other hand, the progress of the development can be retarded, also making it possible to control the development so that the line widths of the peripheral portion may be equal to those of the central portion.

Further, the fluid to be supplied may be air whose pH value has been controlled, in which case substances that adversely affect the development, such as ammonia, can be removed. Where high-humidity air is used as the fluid, moreover, evaporation of the developer can be suppressed, making it possible to prevent the line widths from varying or becoming uneven due to reduction in temperature of the developer induced by heat of vaporization.

To obtain desired line widths by suppressing the evaporation of the developer, the temperature and humidity within the cup CP may be controlled after the developer is applied to the wafer W. To this end, the head member 106 shown in FIG. 9 may be additionally provided with a humidity control mechanism, in order to control the temperature and humidity within the cup CP.

Figure 10:
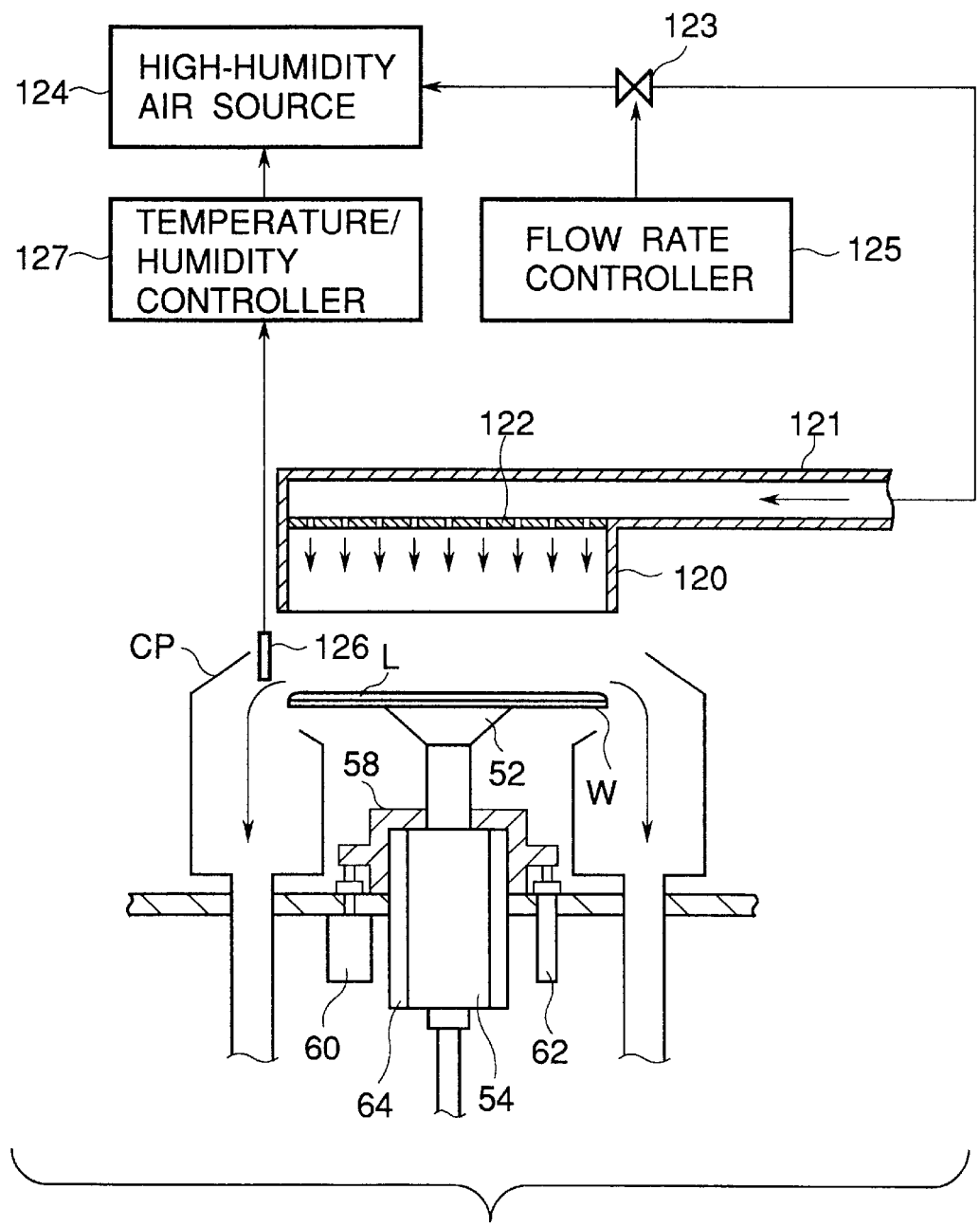
FIG. 10 is a sectional view showing another example of a development control mechanism in the developing unit mounted to the resist coating-development system of FIG. 1.

This purpose can be fulfilled easily by a device shown in FIG. 10, because the ambient temperature and humidity of the wafer W have only to be controlled.

The device shown in FIG. 10 is provided with a cylindrical high-humidity air supply unit 120 whereby high-humidity air whose temperature and humidity have been controlled flows down to the wafer W placed on the spin chuck 52 inside the cup CP and applied with the developer L. The high-humidity air supply unit 120 is connected to a high-humidity air source 124 via a tube 121. Also, the high-humidity air supply unit 120 is provided with a baffle plate 122, which comprises a punching metal or the like and regulates the flow of air from the tube 121 to produce a downward air flow.

A valve 123 is arranged in the tube 121 and the opening thereof is controlled by a flow rate controller 125, whereby the flow rate of the high-humidity air is controlled. A temperature/humidity sensor 126 is arranged inside the cup CP and outputs a detection value thereof to a temperature/humidity controller 127. The temperature and humidity of the air in the high-humidity air source 124 are controlled to respective predetermined values by the temperature/humidity controller 127.

In this case, the temperature of the high-humidity air is preferably set at a value higher by about 1° C. than the ambient temperature, to thereby prevent water vapor from condensing within the high-humidity air supply unit 120.

With the device described above, the high-humidity air whose temperature and humidity have been controlled is guided from the high-humidity air source 124 through the tube 121 and the baffle plate 122 of the unit 120 and flows down to the developer on the wafer W, whereby the humidity and temperature of the air surrounding the wafer W can be kept at a constant high humidity and a constant temperature, respectively, and variations in line width caused by fluctuations in temperature of the developer due to evaporation of the developer can be suppressed.

Specifically, in conventional developing units, development is carried out at a temperature of 23° C. and a humidity of 40% (standard conditions), and the time required for the application of the developer is one minute. Under such standard conditions, about 0.1 cc of the developer evaporates, and the heat of vaporization required at this time causes a drop of the liquid temperature by about 2° C., causing variations in line width. By contrast, where the high-humidity air was controlled with the use of the above-described device such that the temperature and humidity thereof were kept at 23° C. and 60 to 80%, respectively, evaporation of the developer could be prevented and variations in line width could be suppressed.

Figure 11:
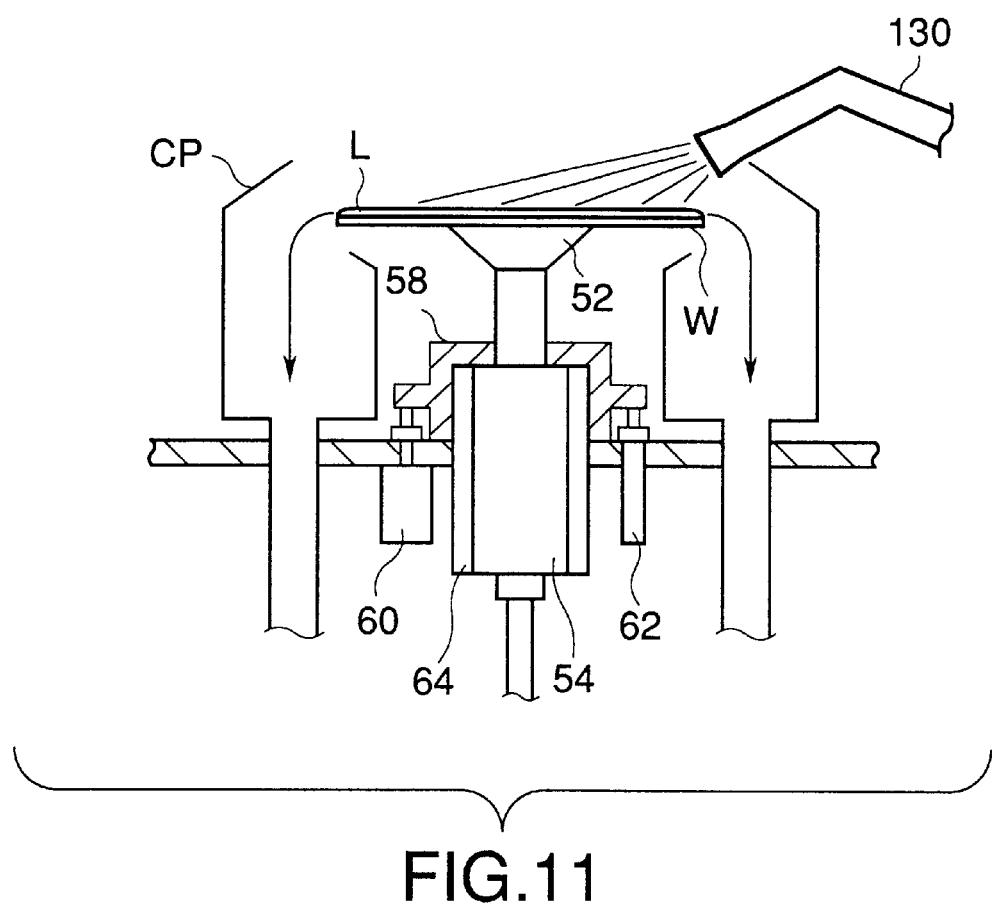
FIG. 11 is a sectional view showing another example of high-humidity air supply as the development control mechanism shown in FIG. 10.

Instead of producing a downward flow of high-humidity air in the manner described above, high-humidity air whose temperature and humidity have been controlled may be supplied from a blower 130 having a discharge opening arranged obliquely above the wafer W, as shown in FIG. 11. In this case, a downward flow of air in the clean room in which the resist coating-development system is arranged may be introduced into the device so that the introduced air may be supplied to the developer on the wafer W after the temperature and humidity thereof are controlled. Further, the devices of FIGS. 10 and 11 can be used to supply a fluid other than high-humidity air insofar as the fluid is to be supplied uniformly to the wafer W.

The present invention is not limited to the foregoing embodiments and may be modified in various ways. For example, although the description of the above embodiments is directed to a coating-development system for processing semiconductor wafers, the present invention is equally applicable to a coating-development system for processing substrates other than semiconductor wafers, such as LCD substrates.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A developing method for use in a photolithographic process comprising the steps of:
    (a) mounting a substrate having a resist coating film exposed to light, on a mounting table;
    (b) aligning a fluid supply mechanism with the substrate mounted on the mounting table; said fluid supply mechanism having a head member and a plurality of fluid discharge sections, said head member having a space for temporarily storing fluid supplied from a fluid supply source, said fluid discharge sections each being communicated with the space, and said head member having a plurality of regions having one or a plurality of fluid discharge sections;
    (c) supplying a developer to the substrate on the mounting table to form a film of a developer so as to cover the resist coating film;
    (d) supplying a fluid to the film of the developer from said fluid discharge sections such that output amount of the fluid is controlled for each of the regions so as to control a resolution of a latent image present in the resist coating film; and
    (e) removing the film of the developer from the resist coating film and rinsing the substrate.

2. The developing method according to claim 1, wherein said plurality of regions are arranged concentrically with said head member.

3. The developing method according to claim 1, wherein said head member has a shape and a size nearly identical with those of the substrate.

4. The developing method according to claim 1, wherein said fluid supply step includes supplying high-humidity air to the developer on the substrate.

5. The developing method according to claim 4, wherein supply quantity, temperature and humidity of the high-humidity air are controlled during the developing process.

6. The developing method according to claim 1, wherein said fluid supply step includes supplying air whose pH value has been controlled to the developer on the substrate.

7. The method according to claim 1, wherein, in the step (c), temperature and humidity of an atmosphere surrounding the substrate on the mounting table are controlled.

8. The method according to claim 7, wherein, in the step (d), an air whose temperature and humidity are controlled, is supplied to the film of the developer.

9. The method according to claim 8, wherein, in the step (d), a supply amount of the air whose temperature and humidity are controlled, is controlled.

10. A developing method for use in a photolithographic process, comprising the steps of:
  (A) mounting a substrate having a resist coating film exposed to light, on a mounting table;
  (B) aligning a fluid supply mechanism with the substrate mounted on the mounting table;
  (C) supplying a developer to the substrate on the mounting table to form a film of a developer so as to cover the resist coating film;
  (D) supplying a high-humidity air to the film of the developer from said fluid supply mechanism such that a supply amount and temperature/humidity of the high-humidity air are controlled to control a resolution of a latent image present in the resist coating film; and
  (E) removing the developer from the resist coating film and rinsing the substrate.

11. The method according to claim 10, wherein, in the step (C), temperature and humidity of an atmosphere surrounding the substrate on the mounting table are controlled.

12. The method according to claim 11, wherein, in the step (D), a second air whose temperature and humidity are controlled, is supplied to the film of the developer, said second air being different from said high-humidity air.

13. The method according to claim 11, wherein, in the step (D), a supply amount of the second air whose temperature and humidity are controlled, is controlled.

14. A developing apparatus for use in a photolithographic process comprising:
  a mounting table for horizontally supporting a substrate having a resist coating film exposed to light;
  a nozzle for supplying the developer to the substrate on the mounting table to form a film of a developer so as to cover the resist coating film;
  a fluid supply mechanism for supplying a fluid to the film of the developer so as to control a resolution of a latent image present in the resist coating film, said fluid supply mechanism having a head member and a plurality of fluid discharge sections, said head member having a space for temporarily storing fluid supplied from a fluid supply source, said fluid discharge sections each being communicated with the space, and said head member having a plurality of regions having one or a plurality of fluid discharge sections;
  wherein said fluid supply mechanism supplies the fluid to the film of the developer from said fluid discharge sections so as to control an output amount of the fluid for each of said regions.

15. The developing apparatus according to claim 14, wherein said plurality of regions are arranged concentrically with said head member.

16. The developing apparatus according to claim 14, wherein said head member has a shape and a size nearly identical with those of the substrate.

* * * * *

UNITED STATES PATENT AND TRADEMARK OFFICE
CERTIFICATE OF CORRECTION

PATENT NO. : 6,190,063 B1
DATED : February 20, 2001
INVENTOR(S) : Masami Akimoto It is certified that error appears in the above-identified patent and that said Letters Patent is hereby corrected as shown below:

<u>Title page,</u>
Item [22], please change "January 4, 1998" to -- January 4, 1999 --

Signed and Sealed this

Nineteenth Day of March, 2002

*Attest:*

JAMES E. ROGAN
*Director of the United States Patent and Trademark Office*

*Attesting Officer*